(12) United States Patent
Lueger et al.

(10) Patent No.: US 7,977,969 B2
(45) Date of Patent: Jul. 12, 2011

(54) CIRCUIT ARRANGEMENT AND METHOD FOR EVALUATING A DATA SIGNAL

(75) Inventors: Manfred Lueger, Preding (AT); Peter Trattler, Graz (AT)

(73) Assignee: austriamicrosystms AG, Unterpremstätten (AT)

( * ) Notice: Subject to any disclaimer, the term of this patent is extended or adjusted under 35 U.S.C. 154(b) by 0 days.

(21) Appl. No.: 12/667,662

(22) PCT Filed: Jul. 2, 2008

(86) PCT No.: PCT/EP2008/058540
§ 371 (c)(1),
(2), (4) Date: Jun. 14, 2010

(87) PCT Pub. No.: WO2009/004043
PCT Pub. Date: Jan. 8, 2009

(65) Prior Publication Data
US 2011/0025377 A1   Feb. 3, 2011

(30) Foreign Application Priority Data
Jul. 2, 2007   (DE) .................. 10 2007 030 569

(51) Int. Cl.
*H03K 19/003* (2006.01)
*H02M 1/10* (2006.01)
(52) U.S. Cl. .................. 326/33; 326/21; 327/547
(58) Field of Classification Search .................... 326/93, 326/31, 33, 21; 327/538, 540, 541, 547
See application file for complete search history.

(56) References Cited

U.S. PATENT DOCUMENTS

| 5,331,220 A | 7/1994 | Pierce et al. | |
| 5,712,589 A * | 1/1998 | Afek et al. | 327/538 |
| 5,781,783 A | 7/1998 | Gunther et al. | |
| 5,867,038 A | 2/1999 | Kartschoke et al. | |
| 6,212,641 B1 | 4/2001 | Frank et al. | |
| 6,259,275 B1 | 7/2001 | Beiu | |
| 7,373,533 B2 * | 5/2008 | Sahu et al. | 713/300 |
| 2002/0101257 A1 | 8/2002 | Kawahara et al. | |
| 2005/0088222 A1 * | 4/2005 | McClure | 327/540 |

FOREIGN PATENT DOCUMENTS

| EP | 0 647 898 | 9/1994 |
| JP | 2003-143000 | 5/2003 |
| WO | WO 2004/107144 | 12/2004 |

OTHER PUBLICATIONS

"AS3681—Power & Lightning Management Unit", Product Brief, revision 1.0, pp. 1-4, austrimicrosystems AG.
"LP3958 Lighting Management Unit with High Voltage Boost Converter", National Semiconductor Corporation, pp. 1-28, Feb. 2006.

* cited by examiner

*Primary Examiner* — James Cho
(74) *Attorney, Agent, or Firm* — Cohen Pontani Lieberman & Pavane LLP

(57) ABSTRACT

A circuit arrangement (10) comprises a circuit terminal (11) for supplying a data signal (DATA) having digital information, a logic circuit (12) that is coupled at an input (22) to the circuit terminal (11) for supplying the digital information, an activation circuit (13), and a voltage regulator (14) that is coupled for activation to an output (18) of the activation circuit (13). The activation circuit (13) comprises an input (16) that is coupled to the circuit terminal (11), a delay element (17) that is coupled to the input (16) of the activation circuit (13), and the output (18), connected to the delay element (17), for emitting an activation signal (SON).

20 Claims, 6 Drawing Sheets

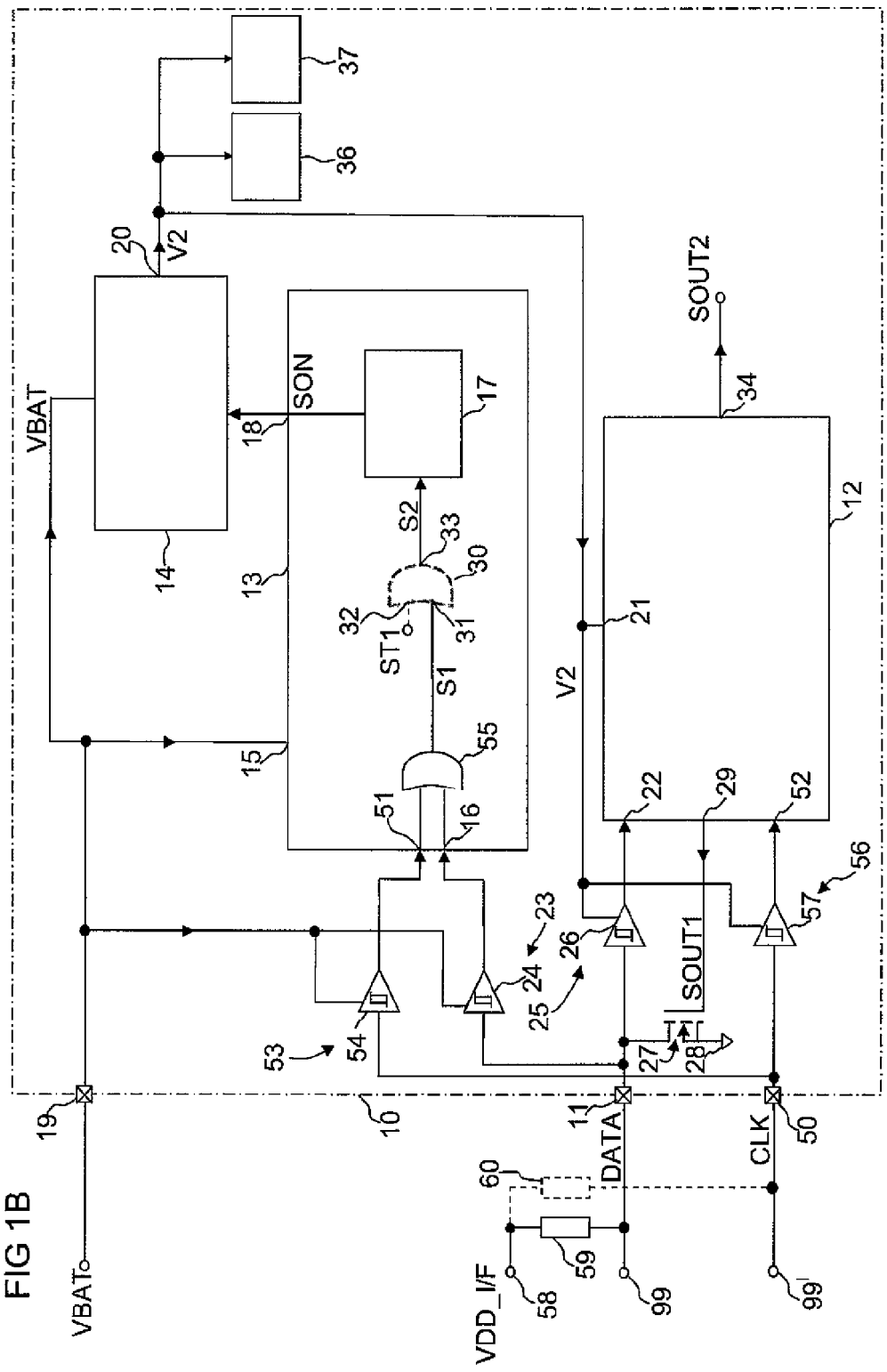

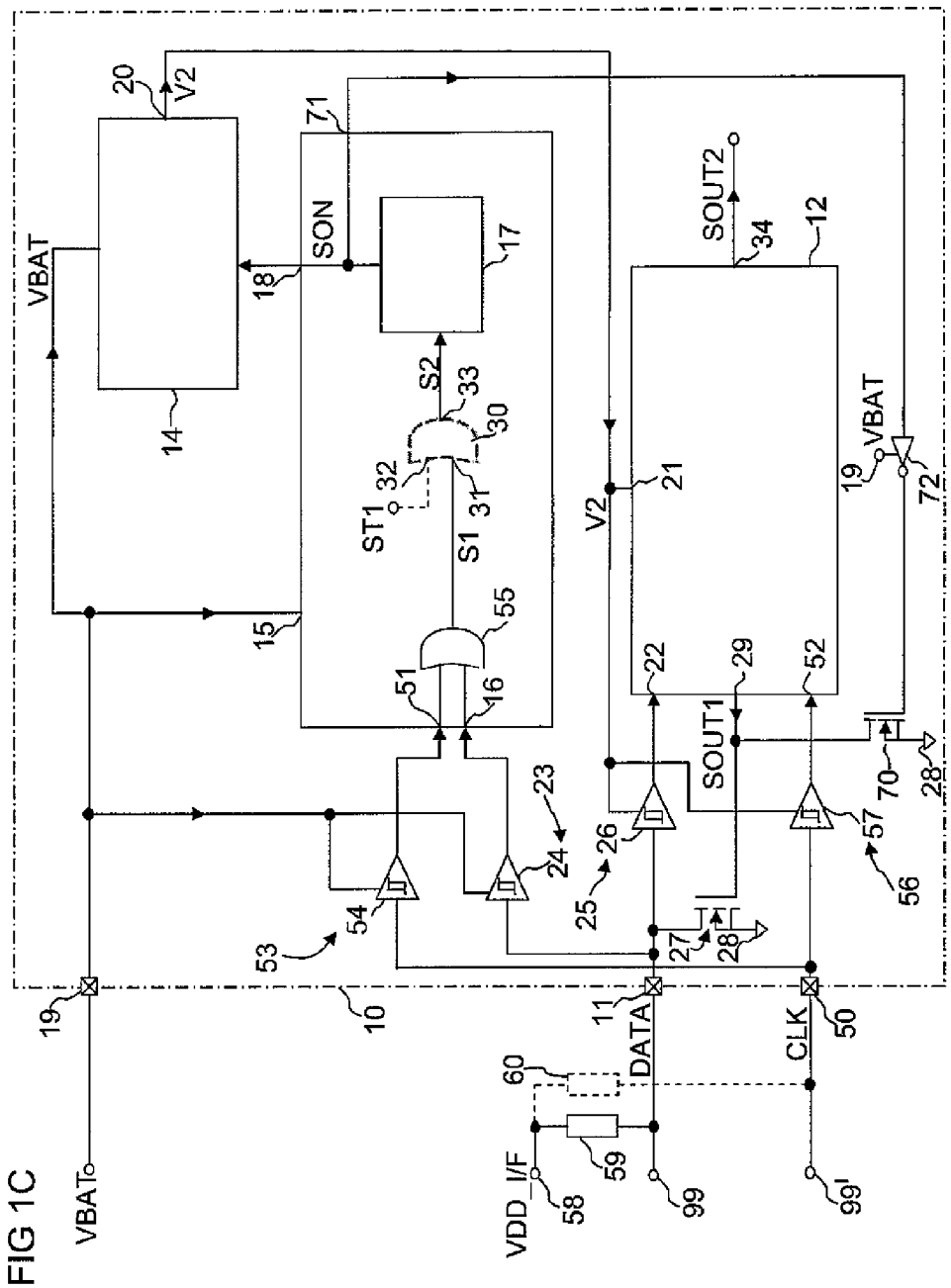

CIRCUIT ARRANGEMENT AND METHOD FOR EVALUATING A DATA SIGNAL

RELATED APPLICATIONS

This is a U.S. national stage of application No. PCT/EP2008/058540, filed on Jul. 2, 2008.

This application claims the priority of German application no. 10 2007 030 569.0 filed Jul. 2, 2007, the entire content of which is hereby incorporated by reference.

FIELD OF THE INVENTION

The present invention relates to a circuit arrangement and a method for evaluating a data signal.

BACKGROUND OF THE INVENTION

A circuit can have a logic circuit and a voltage converter that serves to supply the logic circuit. Digital information is fed to the first input of the logic circuit via a first input of the circuit arrangement. The circuit arrangement can comprise, for example, additional voltage converters that are controlled by the logic circuit according to the digital information. The voltage converter can be activated via a second input of the circuit arrangement. The voltage converter can be switched on and off via the second input.

The document U.S. Pat. No. 5,867,038 concerns a system for detecting signal transitions.

The document WO 2004/107144 A1 describes a system with a circuit for monitoring an input signal.

SUMMARY OF THE INVENTION

An object of the present invention is to provide a circuit arrangement and a method for evaluating a data signal that require a small number of terminals.

In one embodiment, a circuit arrangement comprises a circuit terminal, a logic circuit, an activation circuit and a voltage regulator. One input of the logic circuit is connected to the circuit terminal. One input of the activation circuit is likewise connected to the circuit terminal. The activation circuit has a delay element that is coupled to the input of the activation circuit and to one output of the activation circuit. The voltage regulator is coupled to the output of the activation circuit.

A data signal comprising digital information is supplied to the circuit terminal. The coupling of the input of the logic circuit to the circuit terminal serves to supply the digital information to the logic circuit. The activation circuit generates an activation signal that is emitted at the output of the activation circuit. The connection of the output of the activation circuit to the voltage regulator serves to activate the voltage regulator.

It is advantageous if digital information is fed to the logic circuits and the voltage regulator is activated via the circuit terminal, so that one terminal is sufficient for both functions. The activation circuit can be called a wake-up circuit in English.

In one embodiment, the circuit terminal is implemented as a circuit input. The data signal at the circuit terminal can thus be an input signal. The circuit terminal can be configured as a unidirectional terminal.

In a refinement, this circuit terminal is realized as an input/output terminal, abbreviated I/O terminal. The data signal at the circuit terminal can therefore be an input/output signal. The data signal is present at the circuit terminal. The circuit terminal can be configured as a bidirectional terminal.

In one embodiment, an additional circuit component is coupled to the output of the activation circuit. The additional circuit component is activated by means of the activation signal.

In one embodiment, the voltage regulator comprises an output that is connected to a supply input of the logic circuit. The connection of the output of the voltage regulator to the supply input of the logic circuit serves to supply voltage to the logic circuit. The logic circuit can advantageously be deactivated as soon as the voltage regulator is deactivated, so that the circuit arrangement is in an off state and consumes no electrical energy.

In one embodiment, the voltage regulator comprises a charge pump or an inductive voltage converter. The voltage regulator preferably has a linear regulator. The voltage regulator can be configured as a low-dropout regulator, abbreviated LDO. Since a voltage regulator consumes electrical energy, it can be activated and deactivated by means of the activation signal for reasons of energy efficiency.

In one embodiment, the delay element can be realized as a debounce timer.

In one embodiment, the circuit arrangement can comprise additional voltage converters that are connected to the logic circuit and are controlled by the logic circuit.

In one embodiment, a semiconductor body comprises the circuit arrangement. The semiconductor body comprises a first connection area, "pad" in English, that is connected to the circuit terminal. The first connection area is provided for electrical contacting of the circuit terminals of the circuit arrangement. The first connection area can be contacted by means of a bond wire or by means of a solder ball. The first connection area has a metal on its surface.

The circuit arrangement can be used in a mobile radio device. In one embodiment, this circuit arrangement can be used in an upper part of a clamshell mobile telephone, so that only a small number of connections to a lower part of the mobile telephone are provided.

In one embodiment, a method for evaluating a data signal at a circuit terminal of a circuit arrangement comprises a delay of the data signal. An activation signal is generated as a function of the delayed data signal. A voltage regulator is activated or deactivated as a function of the activation signal. The data signal comprises digital information that is processed by the circuit arrangement.

The data signal advantageously comprises digital information. In addition, the voltage regulator is activated and/or deactivated by means of the data signal, so that only one terminal is sufficient for supplying the digital information and for activating and/or deactivating the voltage regulator.

In one embodiment, the data signal present at the circuit terminal is configured as an input/output signal.

In a refinement, the activation signal is additionally generated as a function of the non-delayed data signal. The activation signal can thus advantageously be provided directly after the arrival of the data signal.

In one embodiment, a first supply voltage is supplied to the voltage regulator, and a second supply voltage is provided by the voltage regulator.

In one embodiment, the digital information of the data signal is processed by a logic circuit that is comprised by the circuit arrangement. The logic circuit can be operated by means of the second supply voltage

BRIEF DESCRIPTION OF THE DRAWINGS

The invention will be described in detail below for several embodiments with reference to the figures. Components and circuit parts that are functionally identical or have the identical effect bear identical reference numbers. Insofar as circuit parts or components correspond to one another in function, a description of them will not be repeated in each of the following figures.

FIGS. 1A to 1C show exemplary embodiments of a circuit arrangement according to the invention.

DETAILED DESCRIPTION OF THE DRAWINGS

Figure 1A:
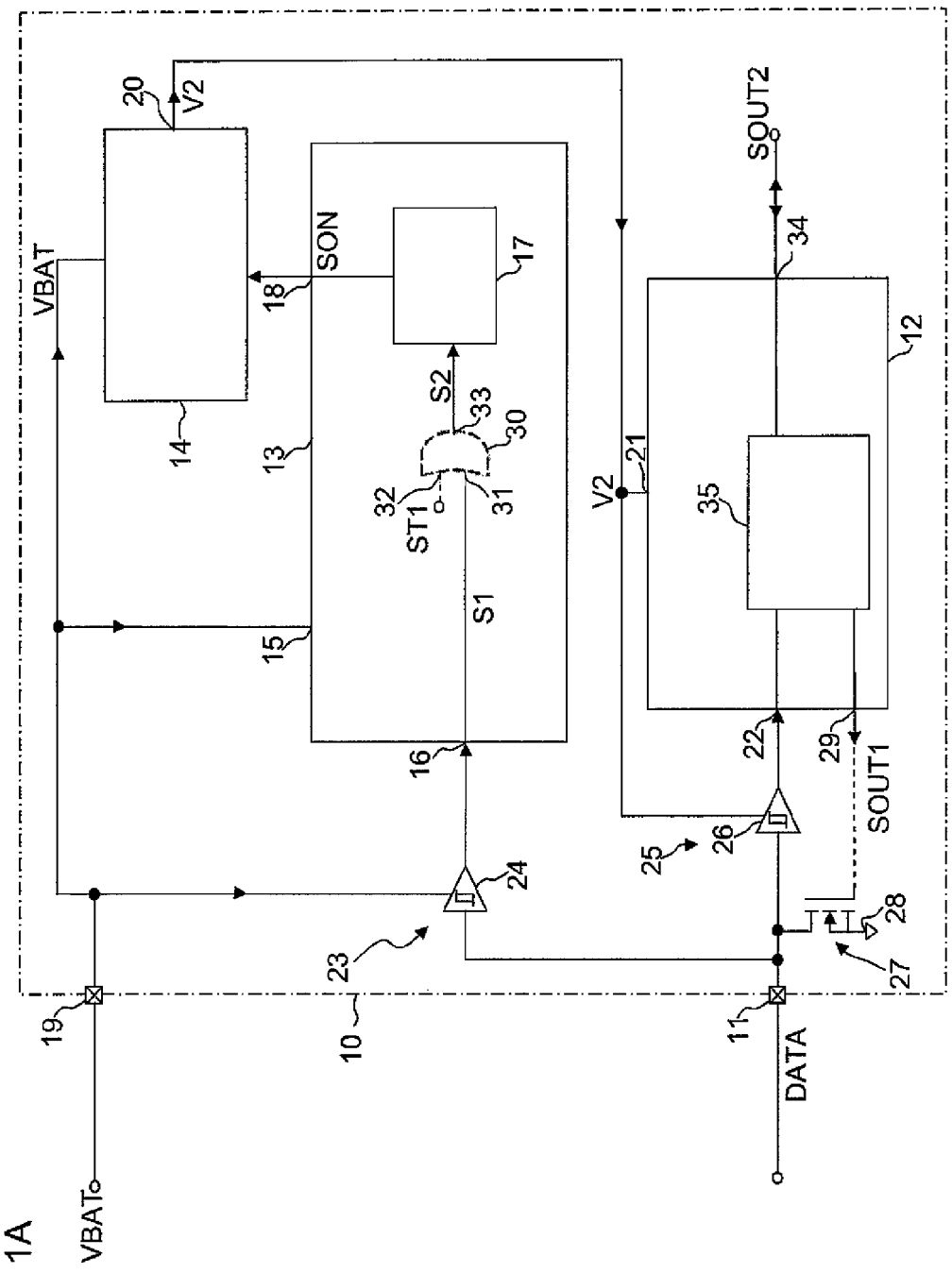

FIG. 1A shows an exemplary embodiment of a circuit arrangement according to the invention. The circuit arrangement 10 comprises a circuit terminal 11, a logic circuit 12, an activation circuit 13 and a voltage regulator 14. The activation circuit 13 comprises an input 16, a delay element 17 and an output 18. The input 16 of the activation circuit 13 is connected to the circuit terminal 11. The delay element 17 is inserted between the input 16 and the output 18 of the activation circuit 13. The output 18 of the activation circuit 13 is connected to the voltage regulator 14. The circuit arrangement 10 comprises a supply voltage terminal 19 that is coupled to the voltage regulator 14. A supply input 15 of the activation circuit 13 is connected to the supply voltage terminal 19. The activation circuit 13 comprises a first logic gate 30. A first input 31 of the logic gate 30 is connected to the input 16 of the activation circuit 13. An output 33 of the first logic gate 30 is connected to the delay element 17.

The voltage regulator 14 comprises an output 20 that is connected to the logic circuit 12. The logic circuit 12 is connected at a supply input 21 to the output 20 of the voltage regulator 14. The logic circuit 12 has an input 22 that is coupled to the circuit terminal 11. The logic circuit 12 further comprises a further output 34.

In addition, the circuit arrangement 10 has a first comparator 23 that connects the circuit terminal 11 to the input 16 of the activation circuit 13. The first comparator 23 is realized as first Schmitt trigger circuit 24. The first comparator 23 is connected to the supply voltage terminal 19. The circuit arrangement further comprises a second comparator 25 that connects the circuit terminal 11 to the input 22 of the logic circuit 12. The second comparator 25 is realized as a second Schmitt trigger circuit 26. The second comparator 25 is connected to the output 20 of the voltage regulator 14. Each of the first and the second Schmitt trigger circuits 24, 26 is constructed as a non-inverting Schmitt trigger circuit. In addition, the circuit arrangement 10 has a transistor 27. A controlled path of the transistor 27 connects the circuit terminal 11 to a reference potential terminal 28. A control terminal of the transistor 27 is connected to a control output 29 of the logic circuit 12.

The logic circuit 12 further comprises a drive circuit 35. The drive circuit 35 is connected to the control output 29. The drive circuit 35 is additionally connected to the input 22. The drive circuit 35 is also coupled to the additional output 34 of the drive circuit. The drive circuit 35 is realized as a digital interface drive logic circuit.

A data signal DATA is supplied to the circuit terminal 11. The data signal DATA is configured here as an input signal. The data signal DATA is fed to the first comparator 23, by which means a first signal S1 is provided on the output side.

The first signal S1 is provided by the first Schmitt trigger circuit 24 by comparison of the data signal DATA with the two threshold values of Schmitt trigger circuit 24. The first signal S1 is fed to the input 16 of the activation element 13. The first signal S1 is thus derived from the data signal DATA. The first logic gate 30 is implemented as an OR gate. A control signal ST1 is fed to a second input 32 of the first logic gate 30. The first signal S1 is fed to the first input 31 of the first logic gate 30. A second signal S2 can be tapped at the output 33 of the first logic gate 30. The second signal S2 is fed to the delay element 17. The second signal S2 is thus also derived from the data signal DATA. On the output side of the delay element 17, an activation signal SON is supplied via the output 18 of the activation circuit 13 to a control input of the voltage regulator 14. A first supply voltage VBAT is fed to the voltage supply terminal 19. The first supply voltage VBAT is supplied to the voltage regulator 14 and is converted by the voltage regulator 14 into a second supply voltage V2. The second supply voltage V2 is fed via the output 20 of the voltage regulator 14 to the supply input 21 of the logic circuit 12. It is likewise supplied to the second comparator 25 to supply the second Schmitt trigger circuit 26. The first supply voltage VBAT is supplied to the supply input 15 of activation circuit 13 to supply the activation circuit 13. In addition, the first supply voltage VBAT is fed to the first comparator 23 to supply the first Schmitt trigger circuit 24.

The data signal DATA is supplied via the second comparator 25 to the input 22 of the logic circuit 12. A first output signal SOUT1, which is fed to the control terminal of transistor 27, can be tapped at the control output 29 of the logic circuit 12. As a function of a first logic value of the first output signal SOUT1, the transistor 27 sets the circuit terminal 11 to a potential value of the reference potential terminal 28. A second output signal SOUT2 can be tapped at the additional output 34 of the logic circuit 12. The second output signal SOUT2 is provided by the logic circuit 12 as a function of information in the data signal DATA. The logic circuit 12 is realized as a serial interface logic circuit with a single input 22. The logic circuit 12 can be referred to as a single wire serial interface logic in English. The first and the second comparators 23, 25 are realized as input buffers.

The data signal DATA can advantageously be controlled by the activation circuit 13 in such a manner that an activation signal SON is provided and the voltage regulator 14 is put into an active operating state by means of the activation signal SON. The logic circuit 12 can advantageously convert information comprised by the data signal DATA into the first and second output signals SOUT1, SOUT2. The voltage regulator 14 can advantageously provide a second supply voltage V2 having a constant value that is not dependent on fluctuations of a value of the first supply voltage VBAT. The logic circuit 12 is advantageously not operated until the value of the second supply voltage V2 is constant. The value of the second supply voltage V2 can be lower than the value of the first supply voltage VBAT. Because of the low and regulated second supply voltage V2, the logic circuit 12 can be produced by means of an integration technology that can be realized in a space-saving manner.

If the control signal ST1 has the logic value 1, then the activation signal SON assumes a value activating the voltage regulator 14. The advantageous effect of the control signal ST1 is that the voltage regulator 14 is activated even if there are no pulses in the data signal DATA. In an alternative embodiment, the first logic gate 30 is eliminated, so that the input 16 of the activation circuit 13 is directly connected to the delay element 17. The first signal S1 provided by the first comparator 23 is thus fed to the delay element 17.

In an alternative embodiment, the transistor 27 is eliminated, so that the second terminal 11 is not connected to the reference potential terminal 28.

In an alternative embodiment, the additional output 34 is constructed as a bidirectional terminal. Thus, a signal SD_I/O present at the bidirectional terminal can be generated, not only by the logic circuit 12, but also by additional circuit components of the circuit arrangement 10 and supplied to the logic circuit 12. The circuit arrangements according to FIGS. 1B and 1C can likewise comprise an additional output 34 constructed as a bidirectional terminal.

In an alternative embodiment, not shown, the circuit arrangement 10 comprises an additional transistor that routes an additional potential to the circuit terminal 11. A control terminal of the additional transistor is coupled to an additional control output of the logic circuit 12. Thus, the circuit terminal can be implemented as a push-pull output.

In an alternative embodiment, the first Schmitt trigger circuit 24 and/or the second Schmitt trigger circuit 26 are respectively implemented as an inverting Schmitt trigger circuit.

In an alternative embodiment, not shown, the first and/or second comparator 23, 26 comprises an inverter or a buffer. The buffer can have two inverters connected in series.

In an alternative embodiment, not shown, an inverter is connected on the output side of the circuit terminal 11.

FIG. 1B shows an additional exemplary embodiment of a circuit arrangement according to the invention. The circuit arrangement according to FIG. 1B is a refinement of the circuit arrangement shown in FIG. 1A. The circuit arrangement 10 according to FIG. 1B further comprises a clock input 50 that is coupled to an additional input 51 of the activation circuit 13 and an additional input 52 of logic circuit 12. A third comparator 53 is inserted between clock input 50 and the additional input 51 of the activation circuit 13. The third comparator 53 is realized as a third Schmitt trigger circuit 54. The first and the third Schmitt trigger circuits 24, 54 are each constructed as a non-inverting Schmitt trigger circuit. The activation circuit 13 comprises a second logic gate 55, which is connected at a first input to the input 16 of the activation circuit 13, and at a second input to the additional input 51 of the activation circuit 13. The second logic gate 55 is connected at one output to the first input 31 of the first logic gate 30. The second logic gate 55 is realized as an OR gate. The third comparator 53 is connected to the supply voltage terminal 19.

The circuit arrangement 10 further comprises a fourth comparator 56 that is inserted between the clock input 50 and the additional input 52 of the logic circuit 12. The fourth comparator 56 is realized as a fourth Schmitt trigger circuit 57. The output 20 of the voltage regulator 14 is connected to the fourth comparator 56 to supply it with its voltage. The circuit terminal 11 is additionally connected via a resistor 59 to a voltage terminal 58. The clock input 50 is likewise connected via an additional resistor 60 to a voltage terminal 58. One terminal 99 is connected to the circuit terminal 11. One terminal 99' is connected to the clock input 50. The logic circuit 12 is realized as a serial interface logic circuit. The logic circuit 12 can be implemented as an inter-integrated circuit, abbreviated I2C circuit.

The circuit terminal 11 and the clock input 50 are constructed here as a two-wire interface for the I2C circuit. The circuit terminal 11 is implemented in this case as an input/output terminal. The circuit arrangement 10 further comprises an analog circuit block 36 that is connected to the output 20 of the voltage regulator 14. The circuit arrangement 10 comprises a digital circuit block 37, which can also be referred to as a digital core, and is connected to the output 20 of the voltage regulator 14.

In an embodiment, the analog circuit block 36 can comprise a current sink, an analog-to-digital converter or a bandgap reference circuit. In an embodiment, the digital circuit block 37 comprises a circuitry with several logic gates such as at least an inverter, a flip-flop, a NOR or a NAND gate. The digital circuit block 37 may comprise a state machine.

A voltage VDD_I/F is applied to the voltage terminal 58. A clock signal CLK of circuit arrangement 10 is applied to the clock input 50. The clock signal CLK is fed via the third comparator 53 and via the additional input 51 of the activation element 13 to the second logic gate 55. By means of the second logic gate 55, the clock signal CLK and the data signal DATA are combined and the first signal S1 is generated from the logic operation. The first signal S1 then has the logic value 1 if either the clock signal CLK or the data signal DATA or both signals CLK, DATA have the logic value 1. Thus, the activation circuit 13 provides the activation signal SON at a value that activates the voltage regulator 14 even if one of the two signals CLK, DATA has the logic value 1. If the clock signal CLK and the data signal DATA continue to have the logic value 0, then the activation signal SON is generated with a value that deactivates the voltage regulator 14. The first and third comparators 23, 53 have the effect that signal values of data signal DATA or clock signal CLK below a predetermined threshold are not taken into consideration. This prevents the activation signal SON from assuming a value activating the voltage regulator 14 if only noise signals with a low level are supplied to the circuit terminal 11 and/or the clock input 50. The effect of the second and fourth comparators 25, 56 is that only a data signal DATA or clock signal CLK having a value above a threshold value are fed to the logic circuit 12, so that the supply of noise signals to the logic circuit 12 is reduced.

At a first logic value of the first output signal SOUT1, the transistor 27 sets the circuit terminal 11 to the potential value of the reference potential terminal 28. The data signal DATA is thus at the logic value 0. At a second logic value of the first output signal SOUT1, the circuit terminal 11 is at the potential value of the voltage terminal 59, insofar as no signal is fed via a terminal 99 to the circuit terminal 11. The data signal DATA is thus at the logic value 1. The data signal DATA is configured here as an output signal. By means of the transistor 27, information present in the logic circuit 12 can also be emitted by the circuit arrangement 10. Thus, overall the data signal DATA has the function of an input and an output signal. The circuit terminal 11 is constructed as a bidirectional terminal. Via the circuit terminal 11, information can be received by the circuit arrangement 10 and information can be emitted to additional circuit arrangements in a temporally offset manner.

The second supply voltage V2 is fed to the analog circuit block 36 and the digital circuit block 37.

The first and the second comparators 23, 25 advantageously consume no energy as long as the logic value 0 with a low voltage value is provided for the off state.

The voltage regulator 14 and the logic circuit 12 can advantageously be deactivated when the voltage VDD_I/F is turned off. In this case, the circuit arrangement 10 is placed in the off state by means of a controlled shutdown process, in which internal registers of the circuit arrangement 10 are reset. The activation circuit 13 thus advantageously serves to activate the circuit arrangement 10 from a state in which it uses no electrical energy. In one embodiment, no additional inputs are necessary for resetting the circuit arrangement 10.

In an alternative embodiment, not shown, the first and the third comparators 23, 53 respectively are implemented as an inverter or as an inverting Schmitt trigger circuit or as a non-inverting Schmitt trigger circuit with an output-side inverter. According to this embodiment, the activation signal SON is provided at a value deactivating voltage regulator 14, so long as the data signal DATA and the clock signal CLK have the logic value 1.

In an alternative embodiment, not shown, the logic circuit 12 according to FIGS. 1B and 1C comprises the drive circuit 35 shown in FIG. 1A. The drive circuit 35 is connected to the control output 29, to the input 22 and/or to the additional output 34 of the drive circuit.

FIG. 1C shows an additional exemplary embodiment of a circuit arrangement according to the invention. The circuit arrangement according to FIG. 1C is a refinement of the circuit arrangement shown in FIG. 1B. The circuit arrangement 10 according to FIG. 1C comprises an additional transistor 70, whose controlled path connects the control output 29 of the logic circuit 12 to the reference potential terminal 28. A control terminal of the additional transistor 70 is coupled to an additional output 71 of activation circuit 13. Additional output 71 of the activation circuit 13 is connected to the output of delay element 17. The additional output 71 is connected via an inverter 72 to the control terminal of the additional transistor 70. The inverter 72 is connected for its supply of voltage via a line not shown, to the supply terminal 19.

If a signal at the additional output 71 of the activation circuit 13 has the logic value 1, then a signal with a low voltage value is fed by means of the inverter 72 to the control terminal of the additional transistor 70. The additional terminal 70 is realized as an n-channel MOSFET. Thus, the additional transistor 70 is switched to the non-conductive state. If, on the other hand, a signal at the additional output 71 has the logic value 0, then a signal with a high voltage value is fed by means of the inverter 72 to the control terminal of additional transistor 70. Due to the high voltage value at the control terminal, the additional transistor 70 is switched to the conductive state, so that a low voltage value is present at the control terminal of the transistor 27, which places the first transistor 27 in a non-conductive operating state. Thus, the first transistor 27 does not pull the voltage at the circuit terminal 11 to the potential value of the reference potential terminal 28 as long as the voltage regulator 14 is not activated.

The circuit terminal 11 is therefore realized as a bus terminal that can have three states, called a tristate bus in English. If the voltage regulator 14 does not provide a second supply voltage V2, the circuit terminal 11 is switched to the high-impedance state, so that the circuit arrangement 10 does not lower the voltage at the circuit terminal 11.

In alternative embodiments, not shown, the circuit arrangements 10 according to FIGS. 1A and 1C comprise the analog circuit block 36 and/or the digital circuit block 37 that are shown in FIG. 1B.

Figure 2A:
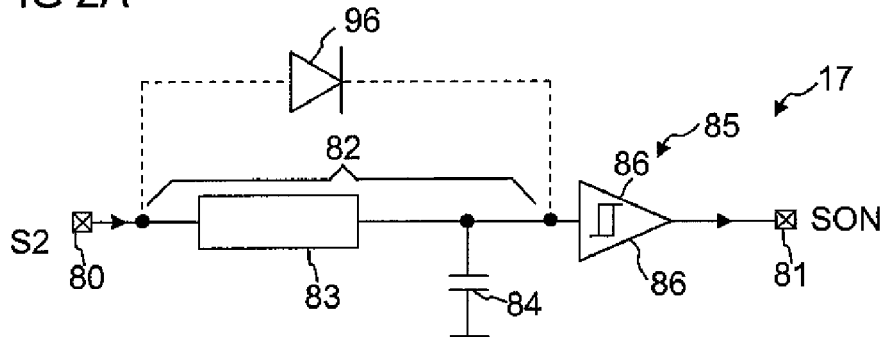
FIGS. 2A to 2E show exemplary embodiments of a delay element.

FIG. 2A shows an exemplary embodiment of a delay element that can be used in one of the circuit arrangements according to FIGS. 1A to 1C. According to FIG. 2A, the delay element 17 comprises an input 80, an output 81 and a low-pass filter 82. The low-pass filter 82 couples input 80 to output 81. The low-pass filter 82 comprises a low-pass resistor 83 and a low-pass capacitor 84. The low-pass filer 82 is designed as an analog low-pass filter. The input 80 is connected via low-pass resistor 83 to a first electrode of low-pass capacitor 84. A second electrode of low-pass capacitor 84 is connected to reference potential terminal 28. The delay element 17 further comprises a comparator 85 that is connected between the low-pass filter 82 and the output 81. The comparator 85 is realized as a Schmitt trigger circuit 86.

The second signal S2 is fed to input 80. Pulses of second signal S2 are filtered by means of the low-pass filter 82. If the filtered second signal S2 exceeds a threshold value of comparator 85, then the activation signal SON at the output 81 is provided at a value that shifts the voltage regulator 14 into an active operating state.

A cut-off frequency fg of low-pass filter 82 and the threshold value of comparator 85 can advantageously be adjusted in such a manner that several pulses of the second signal S2 trigger the activation signal SON at a value activating the voltage regulator 14. The voltage regulator 82 is therefore activated with a delay that is produced by the low-pass filter 82 and the comparator 85. If the second control signal S2 has no further pulses, then after a delay, the activation signal SON takes on a value that deactivates the voltage regulator 14. The activation circuit 13 can therefore be adjusted symmetrically with respect to a switch-on time and a switch-off time of the activation signal SON.

In an alternative embodiment, the delay element comprises a diode 96 inserted between the input 80 and one input of the comparator 85. Thus the second signal S2 is additionally fed to the comparator 85 via the diode 96. A signal at the input of the comparator 85 is provided by a parallel circuit comprising the low-pass filter 82 and the diode 96. The charging of the low-pass capacitor 84 is accelerated by means of the diode 96. Thus the activation signal SON can have the activating value nearly without delay after the arrival of a pulse of the second signal S2.

Figure 2B:
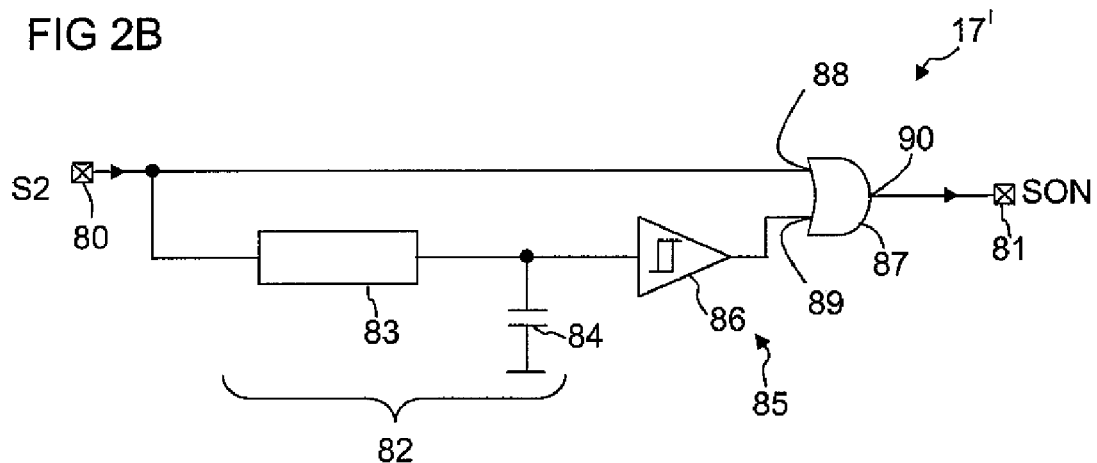

FIG. 2B shows an additional exemplary embodiment of a delay element that can be used in one of the circuit arrangements according to FIGS. 1A-1C. The delay element 17' according to FIG. 2B is a refinement of the delay element shown in FIG. 2A. The delay element 17' comprises a logic gate 87 that is connected at a first input 88 to the input 80 of the delay element 17'. The first input 88 is directly connected to the input 80 of the delay element 17'. A second input 89 of the logic gate 87 is coupled via the comparator 85 and the low-pass filter 82 to the input 80 of the delay element 17'. An output 90 of the logic gate 87 is connected to the output 81 of the delay element 17'. The logic gate 87 is realized as an OR gate.

The second signal S2 is thus directly supplied to the first input 88 of the logic gate 87. In addition, the second signal S2 is fed via the low-pass filter 82 and the comparator 85 to the second input 89 of the logic gate 87. The logic gate 87 provides the activation signal SON at the output 90. If the second signal S2 has the logic value 1, said logic gate 87 provides the activation signal SON likewise at the logic value 1. The voltage regulator 14 is therefore activated without delay when the logic value 1 appears in the second signal S2. The cut-off frequency fg of the low-pass filter 82 and the threshold value of the comparator 85 are adjusted in such a manner that the activation signal SON is provided at a value activating the voltage regulator 14 even if the second signal S2 has a pulse sequence comprising the logic values 1 and 0.

The voltage regulator 14 is advantageously activated by means of the delay element 17' without delay, but deactivated with a delay.

Figure 2C:
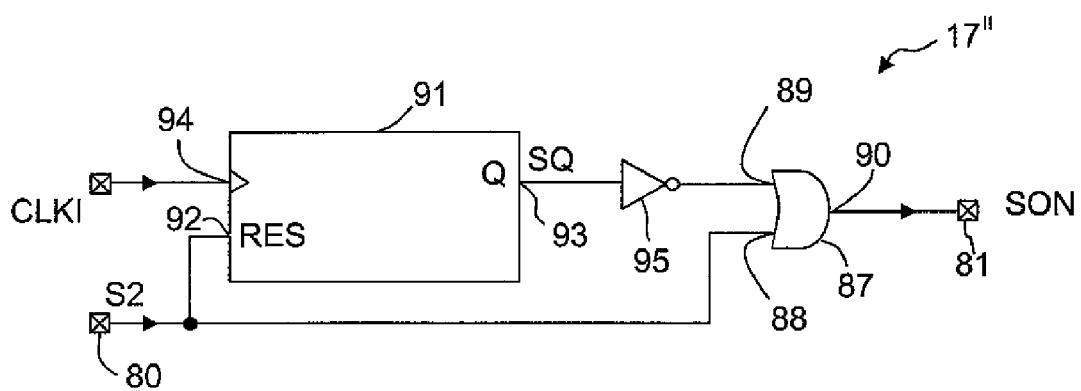

FIG. 2C shows an alternative exemplary embodiment of a delay element that can be used in the circuit arrangements according to FIGS. 1A-1C. The delay element 17" according to FIG. 2C is a refinement of the delay element shown in FIG. 2B. The delay element 17" according to FIG. 2C comprises the logic gate 87, which is connected at a first input 88 to the input 80 of the delay element 17". The delay element 17"

further comprises a counter 91. A reset terminal 92 of the counter 91 is connected to the input 80. A data output 93 of the counter 91 is connected to the second input 89 of the logic gate 87. The delay element 17" comprises an inverter 95 that couples the data output 93 of the counter 91 to the second input 89 of the logic gate 87.

Due to the direct connection of the input 80 to the second input 88 of the logic gate 87, the activation signal SON is provided without delay and directly at a logic value 1, which activates the voltage regulator 14, insofar as the second signal S2 has the logic value 1. A counter clock signal CLKI is fed to a clock input 94 of the counter 91. The counter clock signal CLKI is provided by a clock generator, not drawn in. The second signal S2 is fed to reset the input 92. As soon as the second signal S2 has the logic value 1, the counter 91 is reset. The counter 91 is designed such that, after N pulses of the counter clock signal CLKI, it provides a counter data signal SQ at the output 93 that has the logic value 1. If the counter data signal SQ has the logic value 1, then a logic value 0 is fed via inverter 95 to second input 89. If the second signal S2, which is fed to the first input 88 of the logic gate 87, also has the logic value 0 at this time, then the activation signal SON is provided at a logic value 0, and thus with a value deactivating the voltage regulator 14. If the second signal S2 is fed within N pulses of the counter clock signal CLKI at a logic value 1 to the reset input 92, then the data signal SQ has the logic value 0 and thus the signal at the second input 89 of the logic gate 87 has the logic value 1. The activation signal SON thus provides a value activating the voltage regulator 14 until N pulses of the counter clock signal CLKI have been counted by the counter 91 after a logic value 1 of second signal S2. In one exemplary embodiment, the number N is chosen in such a manner that it corresponds to a delay time of 100 ms.

Thus, the activation signal SON is advantageously provided immediately at the value activating the voltage regulator when a logic value 1 appears in the second signal S2. The activation signal SON also remains at a value activating the voltage regulator 14 for a preset delay time even after the logic value 1 no longer appears in the second signal S2. The activation circuit 13 is advantageously realized as a digital circuit.

Figure 2D:
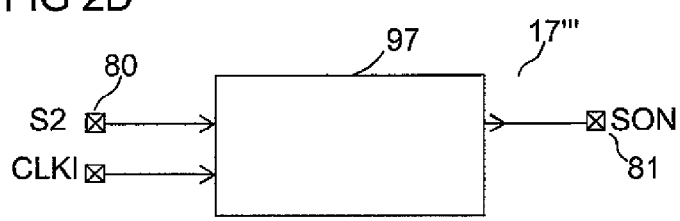

FIG. 2D shows an exemplary embodiment of a delay element that can be used in one of the circuit arrangements according to FIGS. 1A-1C. According to FIG. 2D, the delay element 17''' comprises the input 80, the output 81 and a filter 97. The filter 97 couples the input 80 to the output 81. The filter 97 is constructed as a digital filter. The filter 97 is realized as a low-pass filter.

The second signal S2 is fed via the input 80 to the filter 97. A counter clock signal CLKI is likewise fed to the filter 97. Pulses of the second signal S2 are filtered by means of the filter 97. The activation signal SON is provided at output 81.

Figure 2E:
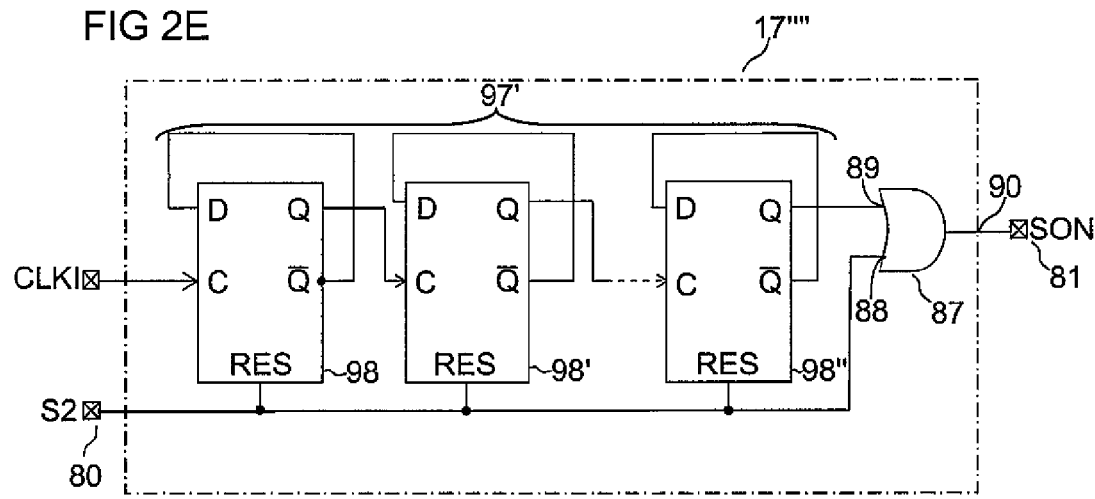

FIG. 2E shows an additional exemplary embodiment of a delay element that can be used in one of the circuit arrangements according to FIGS. 1A-1C. According to FIG. 2E, delay element 17'''' comprises the logic gate 87 and a filter 97' with a flip-flop 98. The flip-flop 98 has a clock input to which a counter clock signal CLKI is fed. A reset input of the flip-flop 98 is connected to the input 80. The first input 88 of the logic gate 87 is connected to the input 80. A data output of flip-flop 98 is connected to the second input 89 of the logic gate 87. An inverting data output of the flip-flop 98 is connected to a data input of the flip-flop 98.

The filter 97' comprises at least one additional flip-flop 98', 98". The flip-flops 98, 98', 98" are connected in series. The series connection of the flip-flops 98, 98', 98" thus forms the digital filter 97'. The data output of one flip-flop here is connected to the clock input of the following flip-flop. The data output of the last flip-flop 98" is connected to the second input 89 of the logic gate 87. The reset inputs of the flip-flops 98', 98" are connected to the input 80. The inverted data outputs of the flip-flops 98', 98" are respectively connected to the data input of the respective flip-flops 98', 98".

The second signal S2 is fed via the input 80 to the filter 97'. A counter clock signal CLKI is likewise fed to the filter 97'. Pulses of the second signal S2 are filtered by means of the filter 97'. The activation signal SON is provided at the output 81. The filter 97' has a low-pass characteristic. FIG. 2E shows a digital filter.

Figure 3:
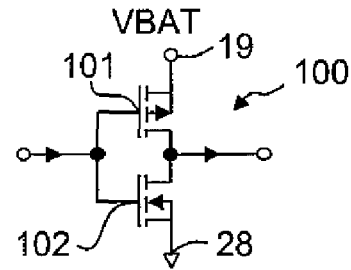
FIG. 3 shows an exemplary embodiment of a comparator.

FIG. 3 shows an exemplary embodiment of a comparator that can be used as comparator 85 in the delay element according to FIGS. 2A and 2B and as one of the comparators 23, 25, 53, 56 in the circuit arrangements according to FIGS. 1A-1C. The comparator comprises an inverter 100. The inverter 100 comprises a p-channel MOSFET 101 and an n-channel MOSFET 102 that are connected to one another in series. The two MOSFETs 101, 102 are inserted between the supply voltage terminal 19 and the reference potential terminal 28. A threshold voltage of the comparator 100 can be adjusted by a threshold voltage and a width-to-length ratio of p-channel MOSFET 101 and a threshold voltage and a width-to-length ratio of n-channel MOSFET 102. If the inverter 100 is used to realize the second and/or third comparator 25, 26, then the two MOSFETs 101, 102 are inserted between the output 20 of the voltage regulator 14 and the reference potential terminal 28. A comparator can advantageously be realized with low expense by means of the inverter 100. With a small voltage at one input of the comparator 85, the comparator 85 in accordance with this embodiment advantageously requires no current.

Figure 4:
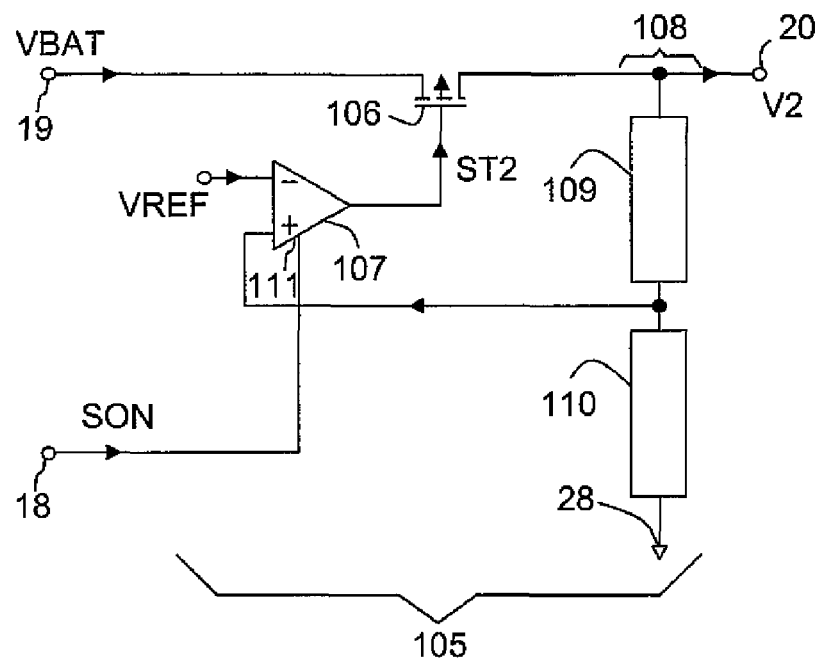
FIG. 4 shows an exemplary embodiment of a voltage regulator.

FIG. 4 shows an exemplary embodiment of a voltage regulator 14 that can be used in the circuit arrangements according to FIGS. 1A to 1C. The voltage regulator 14 preferably comprises a linear regulator 105. The linear regulator 105 has a transistor 106 that is inserted between the supply voltage terminal 19 and the output 20 of the voltage regulator 14. The linear regulator 105 further comprises an amplifier 107 and a voltage divider 108. The voltage divider 108 is inserted between the output 20 and the reference potential terminal 28. The voltage divider 108 has a first and second voltage divider resistor 109, 110. A tap between first and second voltage divider resistors 109, 110 is connected to a non-inverting input of the amplifier 107. The amplifier 107 has an enable input terminal 111. The enable input terminal 111 is connected to the output 18 of the activation circuit 13. One output of the amplifier 107 is connected to a control terminal of the transistor 106. The transistor 106 is realized as a p-channel MOSFET.

A reference voltage VREF is supplied to an inverting input of the amplifier 107. The activation signal SON is fed to enable the input terminal 111. A transistor control signal ST2 at the output of the amplifier 107 is fed to the control terminal of the transistor 106. The transistor 106 provides the second supply voltage V2 as a function of the transistor control signal ST2 and the first supply voltage VBAT. A feedback voltage VFB, which is derived by means of the voltage divider 108 from the second supply voltage V2, is available at the tap of voltage divider 108. The feedback voltage VFB is fed to the non-inverting input of the amplifier 107.

The transistor control signal ST2 is generated as a function of the reference voltage VREF, the feedback voltage VFB and the activation signal SON. If the activation signal SON has the value that activates the voltage regulator 14, then the amplifier 107 generates the transistor control signal ST2 in such a manner that a value of the reference voltage VREF approximately corresponds to a value of the feedback voltage VFB. If, on the other hand, the activation signal SON has the value that deactivates the voltage regulator 14, then the amplifier 107 generates the transistor control signal ST2 in such a manner that transistor 106 is switched to a blocking operating state. In order to block the transistor 106, the transistor control signal ST2 can have approximately the value of first the supply voltage VBAT.

The linear regulator 105 can advantageously provide the second supply voltage V2 at a constant value that is independent of fluctuations of the first supply voltage VBAT. A value of the second supply voltage V2 is lower than a value of the first supply voltage VBAT. A logic circuit 12 can advantageously be operated with a voltage lower than the first supply voltage VBAT. The logic circuit 12 can thereby be realized in a space-saving manner in an integration technology with small scale. The first supply voltage VBAT can be provided, for example, by a lithium-ion battery. This is used in mobile telephones, for example.

In alternative embodiments, not shown, the voltage regulator 14 is implemented as a charge pump or as an inductive voltage converter. The inductive voltage converter can be realized as a buck voltage converter, a boost voltage converter or a buck-boost voltage converter.

Figure 5:
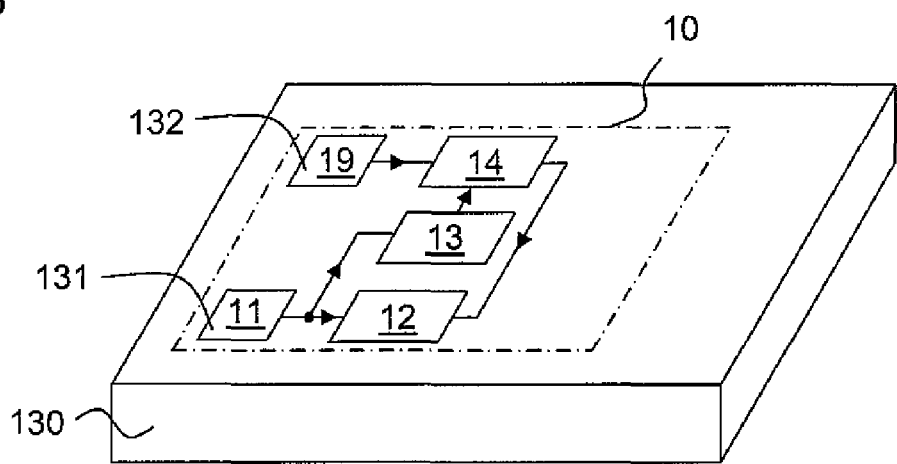
FIG. 5 shows an exemplary embodiment of a semiconductor body with the circuit arrangement.

FIG. 5 shows an exemplary semiconductor body according to the invention of a circuit arrangement according to one of the FIGS. 1A-1C. The semiconductor body 130 has a first connection area 131 that comprises a first circuit terminal 11, and a second connection area 132 that comprises the supply voltage terminal 19. The first and second connection areas 131, 132 can each be contacted with a bond wire or a solder ball.

The semiconductor body 130 advantageously has only a small number of connection areas and can therefore be realized in a space-saving manner. An arrangement with the semiconductor body 130 requires only a small number of connections.

In an alternative embodiment, the semiconductor body 130 comprises a third contact area, not shown, which comprises the clock input 50.

The invention claimed is:

1. A circuit arrangement, comprising:
   a circuit terminal for supplying a data signal having digital information in such a manner that the circuit terminal is configured as a bidirectional terminal and the data signal at the circuit terminal is configured as an input/output signal;
   a logic circuit which is coupled at an input to the circuit terminal for supplying the digital information;
   an activation circuit including
      an input that is coupled to the circuit terminal,
      a delay element that is coupled to the input of the activation circuit, and
      an output, connected to the delay element, for emitting an activation signal; and
   a voltage regulator that is coupled for activation to the output of the activation circuit, wherein an output of the voltage regulator is connected to a supply input of the logic circuit to supply it with voltage.

2. The circuit arrangement according to claim 1 wherein the activation circuit generates the activation signal as a function of one of (i) the delay data signal, and (ii) the delayed data signal and the undelayed data signal.

3. The circuit arrangement according to claim 1, wherein the delay element comprises a low-pass filter that is inserted between an input of the delay element and an output of the delay element.

4. The circuit arrangement according to claim 3, wherein the delay element further comprises a comparator that is connected between the low-pass filter and the output of the delay element.

5. The circuit arrangement according to claim 4, wherein the delay element comprises a logic gate that is connected
   at a first input to the input of the delay element,
   at a second input to the input of the delay element via a series connection comprising the low-pass filter and the comparator, and
   at an output to the output of the delay element.

6. The circuit arrangement according to claim 1, wherein the delay element comprises a counter that is coupled at a reset input to an input of the delay element, and at a data output to an output of the delay element, and to which a counter clock signal is fed at a clock input.

7. The circuit arrangement according to claim 6, wherein the delay element comprises a logic gate that is connected
   at a first input to the input of the delay element,
   at a second input, via the counter, to the input of the delay element, and
   at an output to the output of the delay element.

8. The circuit arrangement according claim 1, wherein the activation circuit comprises a first logic gate which is connected at a first input to the input of the activation circuit, and at an output to the delay element, and to which a control signal is fed at a second input.

9. The circuit arrangement according to claim 1, comprising a third comparator that is inserted between the circuit input and the input of the activation circuit.

10. The circuit arrangement according to claim 9, wherein the first comparator comprises a first Schmitt trigger circuit or an inverter.

11. The circuit arrangement according to claim 1, comprising a second comparator that is inserted between the circuit input and the input of the logic circuit.

12. The circuit arrangement according to claim 11, wherein the second comparator comprises a second Schmitt trigger circuit or an inverter.

13. The circuit arrangement according to claim 1, comprising a clock input that is coupled to an additional input of the activation circuit and an additional input of the logic circuit, wherein the activation circuit comprises a second logic gate that is coupled at a first input to the input of the activation circuit, at a second input to the additional input of the activation circuit, and at an output to the delay element.

14. The circuit arrangement according to claim 1, comprising a transistor that is connected at a control terminal to a control output of the logic circuit, and connects the circuit terminal to a reference potential terminal.

15. The circuit arrangement according to claim 14, comprising an additional transistor that is connected at a control terminal to an additional output of the activation circuit, and connects the control terminal of the transistor to the reference potential terminal.

16. The circuit arrangement according to claim 1, comprising a supply voltage terminal that is connected to the voltage regulator and the activation circuit to supply voltage to the voltage regulator and the activation circuit.

17. A method for evaluating a data signal at a circuit terminal of a circuit arrangement in such a manner that the circuit terminal is configured as a bidirectional terminal and the data signal at the circuit terminal is configured as an input/output signal, comprising the steps of:
- delaying the data signal and emitting an activation signal as a function of the delayed data signal;
- activating or deactivating a voltage regulator as a function of the activation signal; and
- processing digital information which is comprised by the data signal and which is processed by a logic circuit to which a supply voltage provided by the voltage regulator is supplied.

18. The method according to claim 17, wherein the activation signal having a value activating the voltage regulator is provided approximately undelayed, in case the data signal or a signal derived therefrom has a first value.

19. The method according to claim 17, wherein the activation signal having a value activating the voltage regulator is provided, in case the data signal or a signal derived therefrom has a first value after a low-pass filtering.

20. The method according to claim 17, wherein the activation signal having a value activating the voltage regulator is provided, insofar as the data signal or a signal derived therefrom has a first value in a time period with a predetermined duration.

* * * * *